United States Patent [19]

Wertheimer et al.

[11] Patent Number: 5,041,303

[45] Date of Patent: Aug. 20, 1991

[54] PROCESS FOR MODIFYING LARGE POLYMERIC SURFACES

[75] Inventors: Michael R. Wertheimer, Westmount; Henry P. Schreiber, Brossard, both of Canada

[73] Assignee: Polyplasma Incorporated, West Montreal, Canada

[21] Appl. No.: 165,047

[22] Filed: Mar. 7, 1988

[51] Int. Cl.$^5$ .................. C23C 16/50; C23C 16/30; C23C 16/34; C23C 16/40

[52] U.S. Cl. ........................ 427/39; 427/38; 427/40; 427/45.1

[58] Field of Search ............... 427/38, 45.1, 39, 40

[56] References Cited

U.S. PATENT DOCUMENTS

| | | | |
|---|---|---|---|
| 4,401,054 | 8/1983 | Matsuo et al. | 427/45.1 |
| 4,478,874 | 10/1984 | Hahn | 427/40 |
| 4,569,738 | 2/1986 | Kieser et al. | 427/38 |
| 4,585,668 | 4/1986 | Asmussen et al. | 427/38 |
| 4,599,135 | 7/1986 | Tsunekawa et al. | 427/38 |
| 4,667,620 | 5/1987 | White | 427/40 |
| 4,698,234 | 10/1987 | Ovshinsky | 427/294 |
| 4,715,937 | 12/1987 | Moslehi et al. | 427/38 |
| 4,737,379 | 4/1988 | Hudgens et al. | 427/39 |
| 4,752,426 | 6/1988 | Cho | 427/45.1 |
| 4,756,964 | 7/1988 | Kincaid et al. | 424/40 |

FOREIGN PATENT DOCUMENTS 60-016810 1/1985 Japan.

*Primary Examiner*—Shrive Beck
*Assistant Examiner*—Margaret Burke
*Attorney, Agent, or Firm*—Fishman, Dionne & Cantor

[57] ABSTRACT

The disclosure herein describes a process for modifying large polymeric surfaces; a thin, uniform coating is deposited at near ambient temperature on the surfaces in a large-volume plasma apparatus, the plasma state being produced by using electromagnetic energy in the microwave frequency range. The surfaces thus coated constitute a barrier against permeation by oxygen and moisture.

22 Claims, No Drawings

PROCESS FOR MODIFYING LARGE POLYMERIC SURFACES

FIELD OF THE INVENTION

The present invention relates to a method of depositing a thin layer of material upon a surface of a substrate. More particularly, the present invention pertains to the use of gas discharge methods to deposit on surfaces, (low pressure plasma deposition) a thin film providing to the substrate impermeability to gases and vapors such as oxygen and water.

BACKGROUND OF THE INVENTION

Plasma deposition has been used to deposit coatings for improving the barrier between the substrate on which this deposition is effected and the surrounding atmospheric or environmental conditions.

A plasma is a partially ionized gas or vapor containing ions, electrons and various neutral species, many of which are chemically highly reactive. This plasma state may be produced by strong electromagnetic fields, for example at radio or microwave frequency, and the resulting plasma-chemical reactions may be used, for example, to deposit thin film coatings.

There exists a very extensive body of literature on thin films prepared by plasma-enhanced chemical vapor deposition, which films are widely used in microelectronics technology, for example as passivation layers on account of their excellent barrier properties towards water molecules and alkali ions.

U.S. Pat. No. 3,485,666 issued Dec. 23, 1969, to Sterling et al., describes a method of directly depositing an electrically insulating, amorphous, adherent solid layer of silicon nitride upon a surface of a substrate. This method is carried out with a radio frequency power source to establish the plasma.

In this patent, as well as in the literature, reference is sometimes made to the fact that the surface on which the layer is deposited, may be unheated. However, it is, in every case, added that it is desirable to heat the surface in order to improve the bonding within the layer to prevent water or OH groups from being included in the layer. For example, in the above patent, it is stated that the layer of silicon nitride be deposited at a temperature less than 300° C.; but, a subsequent step of heat treating the layer at a temperature of about 700° C. to 900° C. is recommended so that the silicon nitride layers be extremely hard, scratch and acid resistant.

There are three important limitations with this type of plasma deposition procedure. First, the use of a radio frequency plasma generator restricts it to relatively small surfaces or objects, i.e. surfaces or objects which may be placed between the electrodes forming the electric field required to generate the plasma. Second, the heating procedures of the prior art make it impossible to deposit these protective layers on substrates which cannot bear these temperatures without deforming or decomposing. Third, deposition rates by radio frequency plasma are inherently much slower than the same processes carried out at microwave frequency. For practical purposes, therefore, such as in a production line, radio frequency plasmas tend to be too slow, hence not cost effective.

OBJECTS AND STATEMENT OF THE INVENTION

It is therefore an object of the present invention to provide a method of depositing on large heat-sensitive surfaces or objects, particularly polymeric surfaces or objects, a plasma-generated thin barrier film at substantially ambient temperature; the substrate structure is not altered by a heating step in the process, nor is its size or shape a limiting factor in achieving an efficient gas or vapor barrier.

This is accomplished by using electromagnetic energy in the microwave range for generating the plasma. This allows one to avoid the problems of plasma generators of the prior art, which are limited to a relatively small plasma volume; furthermore, the substantially higher deposition rates which can be achieved with microwave plasmas permit much greater productivity, for example in a continuous production line process.

An apparatus by means of which a large volume microwave plasma can be generated is described in the applicant's Canadian patent No. 972,429 issued Aug. 5, 1975, the disclosure of which is incorporated herein. The principal distinguishing feature of said large volume microwave plasma apparatus is the means used for applying the microwave energy in order to create the plasma, the means being one or more slow wave structure applicators.

The present invention is particularly useful in the coating of plastic objects having a relatively large size and complex configuration, such as polyethylene terephtalate (PET) or polycarbonate containers or bottles, which are light, cheap and non-breakable, compared with alternatives, (namely glass or multilayer plastics); however, their permeation rate, to oxygen for example, is excessively high if they are used as containers for perishables such as foods. The invention is also suitable for coative polymeric surfaces based on polyacetal, polyamide, laminates of two or more polymers, and such polyblends, polyalloys, interpenetrating network polymers as may from time-to-time find use in packaging application.

It is also an object of the present invention to provide an effective plasma generated thin coating for such plastic containers or bottles in order to reduce oxygen, carbon dioxide and water permeation and to thereby enhance the life of the contents of such containers and bottles.

It is a further object of the present invention to provide an optically transparent, thin coating which confers greatly reduced overall permeability to a plastic object.

By depositing on these large complex surfaces, at ambient temperature, these plasma generated thin barrier films, advantageous characteristics are achieved, namely: improved barrier properties, optical transparency, adequate flexibility and adherence of the coatings, and improved resistance to abrasion.

Highly effective barriers against vapour and gas transmission have been obtained with plasma silicon nitride (P-SiN); plasma silicon oxide (P-SiO$_2$); plasma silicon oxy-nitride (P-SiON); certain plasma polymers such as organo-silicons, copolymerized in plasma with oxygen; and certain halocarbons.

EXAMPLES

P-SiN films were prepared in a large-volume microwave plasma apparatus using SiH$_4$ and NH$_3$ gas mixtures. Films were deposited on the following substrates: Mylar (trademark) polyethylene terephthalate, polyethylene, polypropylene and Lexan (trademark) polycarbonate, (see Table 1a).

The left-hand side of Table 1a shows the substrate type, the fabrication conditions used to prepare the barrier coating, and the thickness of the latter. The right-hand side shows the flux of water vapor, which was measured using the procedure of ASTM E96-53T for both the uncoated ($F_o$) and coated (F) polymers. Delta F, given by $(F_o - F)/F_o \times 100\%$ is a measure of the barrier's effectiveness. Table 1b provides similar examples for the case of oxygen.

Fabrication parameters strongly affect the film quality, in particular, the flow rate ratio of $SiH_4$ and $NH_3$. sccm), while the $SiH_4$ flow was varied from 7 to 20 sccm. The frequency of the power source, substrate temperature and pressure were kept constant at $f=2.45$ GHz, $T_s=25°$ C. and $p=0.3$ Torr, respectively. Plasma power was varied between 50 and 150 W and plasma volume varied from 1000 $cm^3$ to 1500 $cm^3$. The thickness of deposited film varied from 0.2 to 1.0 $\mu m$.

The best P-SiN coated samples showed a decrease in the water vapor flux up to 99.8%, and in oxygen flux up to 96.8%.

The values cited above are for illustration only, and are in no way intended to restrict the range of operating parameters. For example, much thinner films (less than 0.1 $\mu m$) have been found to constitute equally effective barriers if suitably prepared.

TABLE 1a

MOISTURE PERMEATION IN P—SiN COATED POLYMERS

| # | Substrate | SiH4 (sccm) | NH3 (sccm) | Power (W) | Thickness (A) | Flux (g/m2 day) Uncoated (Fo) | Flux (g/m2 day) Coated (F) | Delta F (%) |
|---|---|---|---|---|---|---|---|---|
| 3 | Mylar (1) | 7 | 45 | 100 | 5000 | 9.25 | 3.30 | 64.3 |
| 5 | Mylar (1) | 15 | 45 | 100 | 5000 | 9.25 | 1.30 | 85.9 |
| 6 | Mylar (1) | 15 | 45 | 100 | 10000 | 9.25 | 4.80 | 48.1 |
| 8 | Mylar (1) | 20 | 45 | 100 | 5000 | 8.80 | 5.30 | 39.8 |
| 11 | PVC | 15 | 45 | 100 | 5000 | 4.10 | 1.50 | 63.4 |
| 12 | Mylar (1) | 10 | 45 | 100 | 3000 | 8.80 | 1.30 | 85.2 |
| 17 | Mylar (1) | 15 | 45 | 100 | 1000 | 8.30 | 5.80 | 30.1 |
| 18 | Mylar (1) | 15 | 45 | 100 | 2000 | 8.30 | 5.60 | 32.5 |
| 19 | Mylar (1) | 15 | 45 | 100 | 4000 | 8.30 | 2.60 | 68.7 |
| 22 | Mylar (1) | 15 | 45 | 100 | 10000 | 8.30 | 3.60 | 56.6 |
| 23 | Mylar (1) | 15 | 45 | 100 | 5000 | 8.30 | 1.80 | 78.3 |
| 24 | Mylar (1) | 15 | 45 | 100 | 5000 | 8.30 | 1.50 | 81.9 |
| 25 | Mylar (1) | 15 | 45 | 100 | 5000 | 8.30 | 1.80 | 78.3 |
| 26 | Mylar (1) | 15 | 45 | 100 | 5000 | 8.30 | 1.20 | 85.5 |
| 34 | Mylar (2) | 15 | 45 | 100 | 5000 | 16.40 | 3.80 | 76.8 |
| 35 | Mylar (2) | 15 | 45 | 120 | 5000 | 16.40 | 4.60 | 72.0 |
| 36 | Mylar (2) | 15 | 45 | 80 | 5000 | 16.40 | 3.90 | 76.2 |
| 37 | Mylar (2) | 15 | 45 | 100 | 5000 | 16.40 | 5.10 | 68.9 |
| 38 | Mylar (3) | 15 | 45 | 100 | 5000 | 28.30 | 6.25 | 77.9 |
| 39 | Mylar (3) | 15 | 45 | 70 | 5000 | 28.30 | 9.90 | 65.0 |
| 40 | Mylar (3) | 15 | 45 | 150 | 5000 | 28.30 | 0.06 | 99.8 |
| 41 | Mylar (3) | 11 | 45 | 120 | 5000 | 28.30 | 3.80 | 86.6 |
| 42 | Lexan | 15 | 45 | 100 | 5000 | 72.70 | 25.40 | 65.1 |
| 43 | Lexan | 10 | 45 | 100 | 5000 | 72.70 | 30.50 | 58.0 |
| 46 | Lexan | 15 | 45 | 100 | 5000 | 72.70 | 29.10 | 60.0 |
| 49 | Lexan | 15 | 45 | 80 | 5000 | 72.70 | 14.50 | 80.1 |
| 50 | Lexan | 15 | 45 | 120 | 5000 | 72.70 | 12.40 | 82.9 |
| 51 | Lexan | 15 | 45 | 100 | 5000 | 72.70 | 16.00 | 78.0 |
| 52 | Mylar (3) | 15 | 45 | 100 | 5000 | 29.20 | 6.70 | 77.1 |
| 53 | Mylar (3) | 15 | 45 | 100 | 3000 | 29.20 | 7.00 | 76.0 |
| 54 | Mylar (3) | 15 | 45 | 100 | 5000 | 29.20 | 6.40 | 78.1 |
| 55 | Mylar (3) | 15 | 45 | 100 | 3000 | 29.20 | 5.30 | 81.8 |
| 57 | Mylar (3) | 10 | 30 | 100 | 5000 | 29.20 | 10.30 | 64.7 |
| 58 | Mylar (3) | 20 | 50 | 100 | 5000 | 29.20 | 11.10 | 62.0 |

N.B.: p = 0.3 Torr

The $NH_3$ flow rate for all the series of samples used was 45 sccm, except sample 57 (30 sccm) and sample 58 (50

TABLE 1b

OXYGEN PERMEATION MEASUREMENTS*

| SAMPLE # | SUBSTRATE | PRESSURE (02) (psig) | TIME (h) | PERMEABILITY (cc/100 in² atm) |
|---|---|---|---|---|
| EXPERIMENTAL PROCEDURE | | | | |
| uncoated | Mylar (1) | 50 | | 1.6 |
| 26 | Mylar (1) | 50 | 72 | 0 |
| 24 | Mylar (1) | 50 | 48 | 0 |
| uncoated | Lexan | 20 | | 72.5 |
| uncoated | Lexan | 20 | | 71.5 |
| 50 | Lexan | 20 | 12 | 0 |
| 51 | Lexan | 20 | 12 | 0 |
| 50 | Lexan | 40 | | 6.9 |
| 51 | Lexan | 40 | | 10.4 |
| uncoated | Mylar (3) | 40 | | 16.7 |
| 55 | Mylar (3) | 40 | | 2.6 |

*Based on ASTM test method D-1434

The following is a list of possible thin film barrier materials to be used in the present invention.

1. Inorganic Films 1.1 Silicon compounds (made by co-reacting $SiH_4$, also known as mono-silane, with at least one other gas)

P-SiN = ($SiH_4 + NH_3$ and/or $N_2$)
P-SiO = ($SiH_4 + N_2O$)
P-SiO:P = ($SiH_4 + N_2O + PH_3$)
P-SiON = ($SiH_4 + NH_3 + N_2O$)
a-SiC:H = ($SiH_4 + CH_x$)
a-Si:H = ($SiH_4$ alone or with an inert gas such as Ar, He, Ne or with hydrogen)

Similar reactions can also be carried out using higher silanes (e.g. $Si_2H_6$) or their halogenated equivalents (e.g. $SiF_4$, $SiCl_4$, etc.)

1.2 metal compounds made by plasma deposition from a volatile organometallic compound (see Table 2):
if reacted alone, these form metal-containing plasma polymers (see category 2.3 below)
if co-reacted with $O_2$ or $NH_3$, they can form oxides or nitrides, as in the case of silicon compounds above.

2. Organosilicones or Organometallics

A drawback of group 1.1 is that the principal reagent, silane, is dangerous (toxic and flammable in air). It may therefore be desirable to arrive at Si compound films starting from less dangerous compounds (organosilicones) (see table 3).

2.1 Organosilicon plasma polymers

These result from reaction of the "monomer" gas alone, or combined with an inert gas. (see table 3)

2.2 Silicon compounds (same list as in 1.1)

These can be obtained by co-reacting a monomer with oxygen (which yields P-SiO) or with oxygen and ammonia or nitrogen (which yields P-SiON). The role of oxygen is to "burn" (i.e. oxidize to form $CO_2$ and $H_2O$) the organic part of the organosilicon monomer.

2.3 Organometallic plasma polymers

Same comments as in 2.1 above, but using compounds from table 2.

2.4 Metal compounds

Same comments as in 2.2 above, but using compounds from table 2.

3. Plasma Polymers and Diamond-like Carbon 3.1 Plasma Polymers

These are thin films produced from volatile organic compounds (i.e. other than organosilicon or organometallic, which are treated in category 2 above). These may be:
hydrocarbons
halocarbons
other organics containing O, N, S . . .

One preferred embodiment of the invention is to produce thin plasma polymer equivalents of known "conventional" barrier materials, namely:
vinylidene chloride
ethylene-vinyl alcohol (EVAL)
others 3.2 Diamond-like carbon Under suitable conditions, hydrocarbons may be converted in the plasma to diamond-like carbon films (symbolized by a-C:H). This material is very dense and has good barrier characteristics.

Although the invention has been described above in relation to specific embodiments, it will be evident to a person skilled in the art that it may be refined and modified in various ways. It is therefore wished to have it understood that the present invention should not be limited in interpretation except by the terms of the following claims.

TABLE 2

The following organometallic Monomers and mixtures may be used for depositing films as taught in the present invention.

| MONOMER (or mixture) | Structural formula |
|---|---|
| Copper phtalocyanine | $[Ph(CN)_2]_4Cu$ |
| Acetylacetonatedimethylgold | $Me_2AuOC(Me)=CHC(Me)O$ |
| Diethylzinc | $Et_2Zn$ |
| Diethylzinc/Diethylselenide | $Et_2Zn/Et_2Se$ |
| Dimethylmercury | $Me_2Hg$ |
| Trimethylaluminium/Ammonia or Nitrogen | $Me_3Al/NH_3$ or $N_2$ |
| Tri-sec-butyloxyaluminium | $(sec-BuO)_3Al$ |
| Tetramethylgermanium | $Me_4Ge$ |
| Tetramethylgermanium/Oxygen | $Me_4Ge/O_2$ |
| Tetramethyltin | $Me_4Sn$ |
| Tetramethyltin/Oxygen | $Me_4Sn/O_2$ |
| Tetramethyltin/Ammonia | $Me_4Sn/NH_3$ |
| Tetramethyltin/Nitrogen or Methane of Acetylene | $Me_4Sn/N_2$ or $CH_4$ or $C_2H_2$ |
| Tetramethyltin/Propene | $Me_4Sn/H_2C=CHMe$ |
| Tetramethyltin/Methylmethacrylate | $Me_4Sn/H_2C=C(Me)CO_2Me$ |
| Tetramethyltin/Perfluorobenzene | $Me_4Sn/C_6F_6$ |
| Trimethylethyltin | $Me_3SnEt$ |
| Trimethylvinyltin | $Me_3SnCH=CH_2$ |
| Trimethylethynyltin | $Me_3SnC=CH$ |
| Butyltrivinyltin | $BuSn(CH=CH_2)_3$ |
| Tetramethyllead | $Me_4Pb$ |
| Pentaethoxytantalum | $(EtO)_5Ta$ |
| Trimethylbismuth | $Me_3Bi$ |
| Dicyclopentadienylmanganese | $(C_5H_5)_2Mn$ |
| Ferrocene | $(C_5H_5)_2Fe$ |
| Vinylferrocene | $H_2C=CHC_5H_4FeC_5H_5$ |
| Cyclopentadienydicarbonylcobalt | $C_5H_5Co(CO)_2$ |
| Allylcyclopentadienylpalladium | $H_2C=CHCH_2PdC_5H_5$ |

TABLE 3

The following Organosilicon Monomers and mixtures with other gases may be used for depositing films as taught in the present invention.

| MONOMER (or mixture) | Structural Formula |
|---|---|
| Tetramethylsilane | $Me_4Si$ |
| Tetramethylsilane/Oxygen | $Me_4Si/O_2$ |
| Tetramethylsilane/Ammonia | $Me_4Si/NH_3$ |
| Tetramethylsilane/Hydrogen/Argon | $Me_4Si/H_2/Ar$ |
| Tetramethylsilane/Tetrafluoromethane | $Me_4Si/CF_4$ |
| Ethyltrimethylsilane | $EtSiMe_3$ |
| Vinyltrimethylsilane | $H_2C=CHSiMe_3$ |
| Vinyltrimethylsilane/Tetrafluoromethane | $H_2C=CHSiMe_3/CF_4$ |
| Ethylnyltrimethylsilane | $HC=CSiMe_3$ |
| Ethylnyltrimethylsilane/Tetrafluoromethane | $HC=CSiMe_3/CF_4$ |
| Allytrimethylsilane | $H_2C=CHCH_2SiMe_3$ |
| Trimethylchlorosilance | $Me_3SiCl$ |
| Phenylsilane | $PhSiH_3$ |
| p-Chlorophenylsilane | $Cl-PhSiH_3$ |
| Diphenylsilane | $Ph_2SiH_2$ |
| Hexamethyldisilane | $(Me_3Si)_2$ |
| Bis(trimethylsilyl)methane | $(Me_3Si)_2CH_2$ |
| Disilybenzene | $(H_3Si)_2C_6H_4$ |
| Methyldimethoxysilane/Oxygen | $MeHSi(OMe)_2/O_2$ |
| Dimethyldimethoxysilane | $Me_2Si(OMe)_2$ |
| Methyltrimethoxysilane | $MeSi(OMe)_3$ |
| Methyltrimethoxysilane/Oxygen | $MeSi(OMe)_3/O_2$ |

TABLE 3-continued

The following Organosilicon Monomers and mixtures with other gases may be used for depositing films as taught in the present invention.

| MONOMER (or mixture) | Structural Formula |
| --- | --- |
| Vinyltrimethoxysilane | $H_2C=CHSi(OMe)_3$ |
| Tetramethoxysilane | $(MeO)_4Si$ |
| Vinyldimethylethoxysilane | $H_2C=CHMe_2SiOEt$ |
| Vinyldimethylethoxysilane/ | $H_2E=CHMe_2SiOEt/$ |
| Styrene | $PhCH=CH_2$ |
| Vinyltriethoxysilane | $H_2C=CHSi(OEt)_3$ |
| Ethynyltriethoxysilane | $HC\equiv CSi(OEt)_3$ |
| γ-Aminopropyltriethoxysilane | $H_2N(CH_2)_3Si(OEt)_3$ |
| Tetraethoxysilane | $(EtO)_4Si$ |
| Tetraethoxysilane/Oxygen | $(EtO)_4Si/O_2$ |
| Trimethyvinyloxysilane | $Me_3SiOCH=CH_2$ |
| Tetramethyldisiloxane | $(Me_2SiH)_2O$ |
| Tetramethyldisiloxane/Oxygen | $(Me_2SiH)_2O_2/O_2$ |
| Hexamethyldisiloxane | $(Me_3Si)_2O$ |
| Hexamethyldisiloxane/Ammonia | $(Me_3Si)_2O/NH_3$ |
| Hexamethyldisiloxane/Vinyl-trimethylsilane | $(Me_3Si)_2O/H_2C=CHSiMe_3$ |
| Hexamethyldisiloxane/Toluene | $(Me_3Si)_2O/PhMe$ |
| Divinyltetramethyldisiloxane | $(H_2C=CHSiMe_2)_2O$ |
| Hexamethylcyclotrisiloxane | $(Me_2SiO)_3$ |
| Octamethylcyclotetrasiloxane | $(Me_2SiO)_4$ |
| Dimethylaminotrimethylsilane | $Me_2NSiMe_3$ |
| Diethylaminotrimethylsilane | $Et_2NSiMe_3$ |
| Bis(dimethylamino)methylsilane | $(Me_2N)_2SiHMe$ |
| Bis(dimethylamino)methyl-vinylsilane | $(Me_2N)_2SiMeCH=CH_2$ |
| Hexamethyldisilazane | $(Me_3Si)_2NH$ |
| Hexamethyldisilazane/Nitrogen | $(Me_3Si)_2NH/N_2$ |
| Hexamethyldisilazane/Toluene | $(Me_3Si)_2NH/PhMe$ |
| Hexamethylcyclotrisilazane | $(Me_2SiNH)_3$ |
| Hexamethylcyclotrisilazane/Ammonia | $(Me_2SiNH)_3/NH_3$ |
| NN'Bis(dimethylsilyl)tetra-methylcyclodisilazane | $(Me_2SiNSiHMe_2)_2$ |
| Hexamethyldisilathiane | $(Me_3Si)_2S$ |

The embodiments of the invention in which an exclusive property or privilege is claimed are defined as follows:

1. A method of providing a plasma generated thin permeation barrier, against transmission of a gas or vapor, on a large polymeric surface, said method comprising:
   depositing a film by plasma at substantially ambient temperature on said surface, said plasma being produced by electromagnetic energy in the microwave frequency range using slow wave structure applicator means;
   whereby to form on said surface said plasma generated thin permeation barrier.

2. A method as defined in claim 1, wherein said barrier is one against transmission of oxygen, carbon dioxide and water vapor.

3. A method as defined in claim 2, wherein said barrier is an inorganic film.

4. A method as defined in claim 3, wherein said barrier is a silicon compound made by co-reacting silane with a second gas, or gas mixture, chosen among the following group: ammonia, nitrogen, nitrous oxide or other oxides of nitrogen, water vapor, hydrocarbon and an inert gas.

5. A method as defined in claim 4, wherein said second gas, or gas mixture, is nitrogen and ammonia; said inorganic film being plasma silicon nitride.

6. A method as defined in claim 4, wherein said second gas is nitrous oxide or other oxide of nitrogen, or water vapor; said inorganic film being plasma silicon dioxide.

7. A method as defined in claim 4, wherein said second gas is a mixture comprising a source of nitrogen and a source of oxygen, said inorganic film being plasma silicon oxynitride.

8. A method as defined in claim 4, wherein said second gas is a hydrocarbon or other source of carbon; said inorganic film being plasma silicon carbide.

9. A method as defined in claim 4, wherein said second gas is a mixture of nitrous oxide and phosphine; said inorganic film being phosphosilicate glass.

10. A method as defined in claim 4, wherein said second gas is taken from the group including Ar, He, Ne and hydrogen; said inorganic film being amorphous, hydrogenated silicon.

11. A method as defined in claim 3, wherein said inorganic film is a metal compound made from a volatile organometallic compound.

12. A method as defined in claim 1, wherein said barrier is derived from an organosilicon monomer.

13. A method as defined in claim 12, wherein said monomer is reacted in the presence of an inert gas.

14. A method as defined in claim 12, wherein said monomer is reacted with oxygen to yield plasma silicon oxide.

15. A method as defined in claim 12, wherein said monomer is reacted with oxygen and ammonia to yield plasma silicon oxynitride.

16. A method as defined in claim 12, wherein said monomer is reacted with oxygen and nitrogen to yield plasma silicon oxynitride.

17. A method as defined in claim 1, wherein said large surface consists of polyethylene terephthalate.

18. A method as defined in claim 1, wherein said large surface consists of polycarbonate.

19. A method as defined in claim 1, wherein said large surface consists of polypropylene.

20. A method as defined in claim 1, wherein said large surface consists of polyethylene.

21. A method as defined in claim 1, wherein said large surface consists of polyvinyl chloride.

22. A method as defined in claim 1, wherein said large surfaces consist of polyacetal, polyamide, laminates of two or more polymers, and polyblends, polyalloys, interpenetrating network polymers.

* * * * *